United States Patent [19]

Iwabuchi et al.

[11] Patent Number: 5,073,517

[45] Date of Patent: Dec. 17, 1991

[54] DOPANT FILM AND METHODS OF DIFFUSING IMPURITY INTO AND MANUFACTURING A SEMICONDUCTOR WAFER

[75] Inventors: Masaburo Iwabuchi, Yokohama; Hideyoshi Ito, Hyogo; Kenji Unetsubo, Tatsuno, all of Japan

[73] Assignee: Kabushiki Kaisha Toshiba, Kawasaki, Japan

[21] Appl. No.: 600,584

[22] Filed: Oct. 18, 1990

Related U.S. Application Data

[62] Division of Ser. No. 263,202, Oct. 27, 1988, Pat. No. 5,024,867.

[30] Foreign Application Priority Data

Oct. 28, 1987 [JP] Japan .............................. 62-272114
Jul. 14, 1988 [JP] Japan .............................. 63-173714

[51] Int. Cl.$^5$ .......................................... H01L 21/22
[52] U.S. Cl. .................................... 437/153; 437/955; 437/974; 148/DIG. 135
[58] Field of Search ............... 437/152, 153, 154, 946, 437/955, 966, 974; 148/DIG. 36, DIG. 135

[56] References Cited

U.S. PATENT DOCUMENTS

| | | | |
|---|---|---|---|
| 3,971,870 | 7/1976 | Christensen et al. | 428/336 |
| 4,391,658 | 7/1983 | Kitone et al. | 437/955 |
| 4,756,968 | 7/1988 | Ebe et al. | 428/343 |
| 4,853,286 | 8/1989 | Narimatsu et al. | 428/343 |

FOREIGN PATENT DOCUMENTS

| | | |
|---|---|---|
| 0252739 | 1/1988 | European Pat. Off. |
| 54-84474 | 7/1979 | Japan |
| 59-196380 | 11/1984 | Japan |

*Primary Examiner*—Brian E. Hearn
*Assistant Examiner*—C. Chaudhari
*Attorney, Agent, or Firm*—Finnegan, Henderson, Farabow, Garrett, and Dunner

[57] ABSTRACT

A dopant film contains an organic binder, an inorganic binder and a compound of an impurity element for diffusion. Both surfaces of the dopant film are coated with adhesive. Releasable sheets sandwich the dopant film. The dopant film permits automated alternate stacking with semiconductor wafers, providing an advantage of labor saving. When the alternate stacking is automated, it will become hard for the wafer breakage to occur, sharply decreasing the rate of breakage. Furthermore, since the adhesion of a semiconductor wafer improves, the variation in the diffusion depth will decrease. The semiconductor wafer manufacturing method includes the steps of impurity diffusion into both surfaces, dividing the wafer into two wafers in the direction of thickness, and polishing to a mirror surface each divided wafer opposite to the surface on which the impurity diffusion layer is formed. The material loss per wafer is reduced more than the conventional method due to the slicing into two wafers.

5 Claims, 6 Drawing Sheets

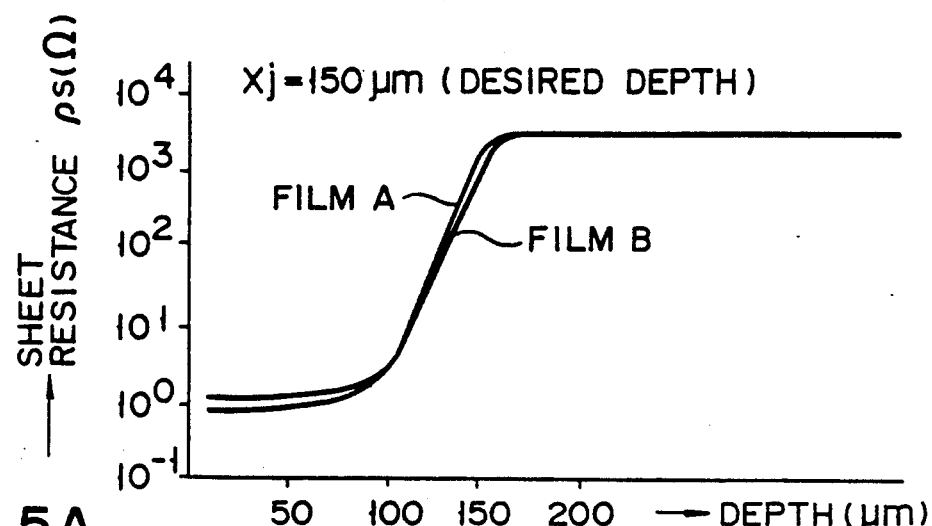
F I G. 5A
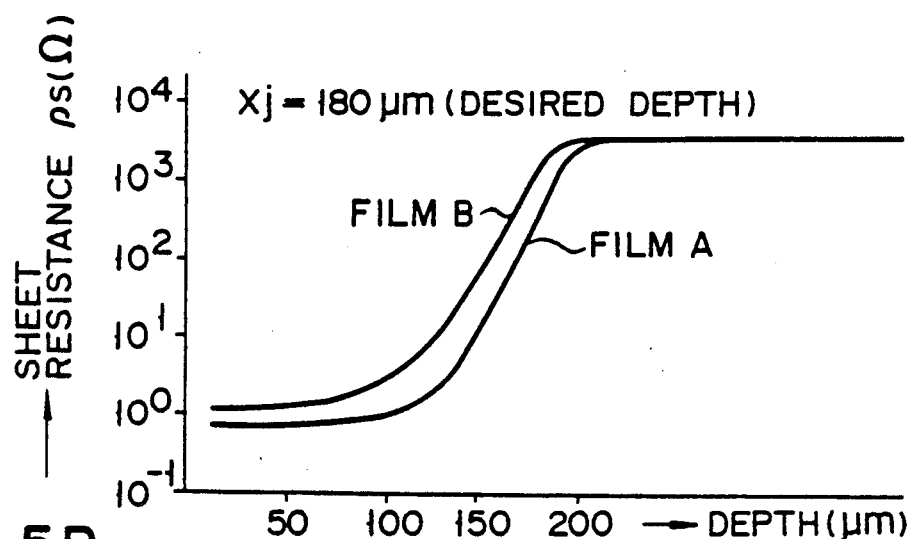
F I G. 5B
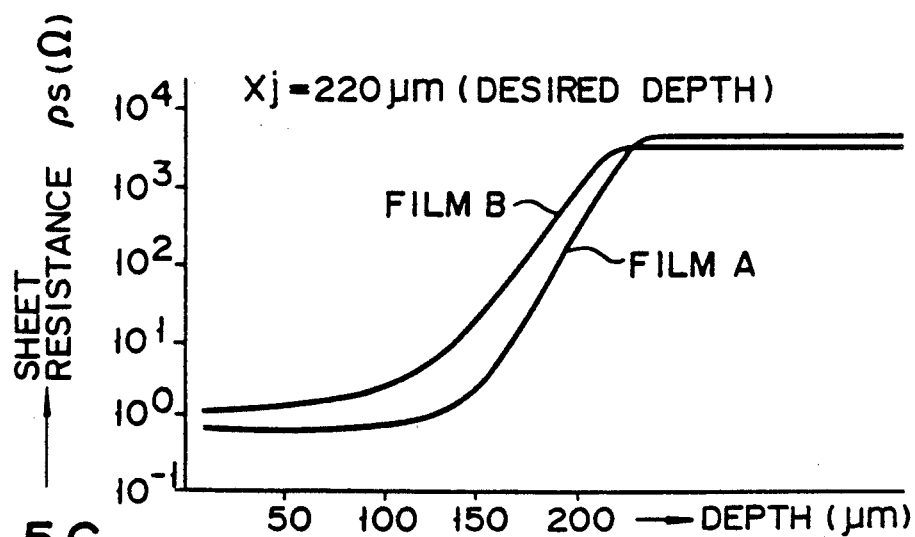
F I G. 5C

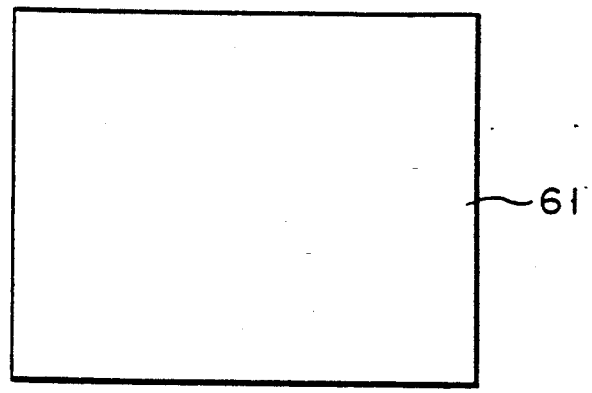
F I G. 6A
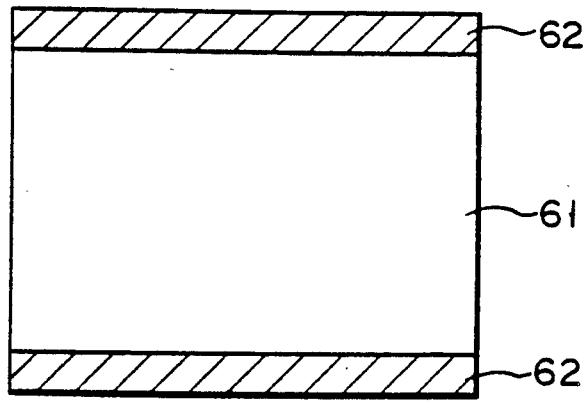
F I G. 6B
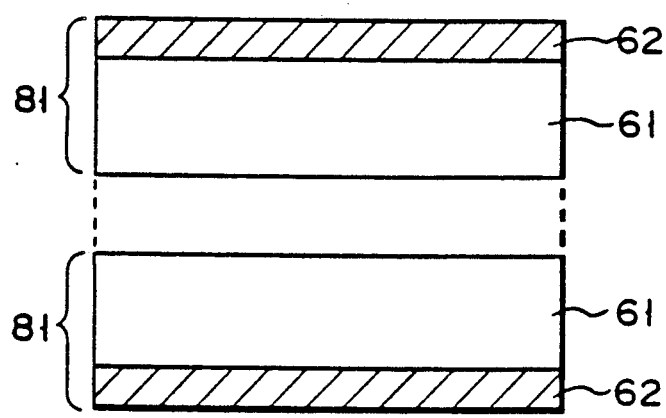
F I G. 6C

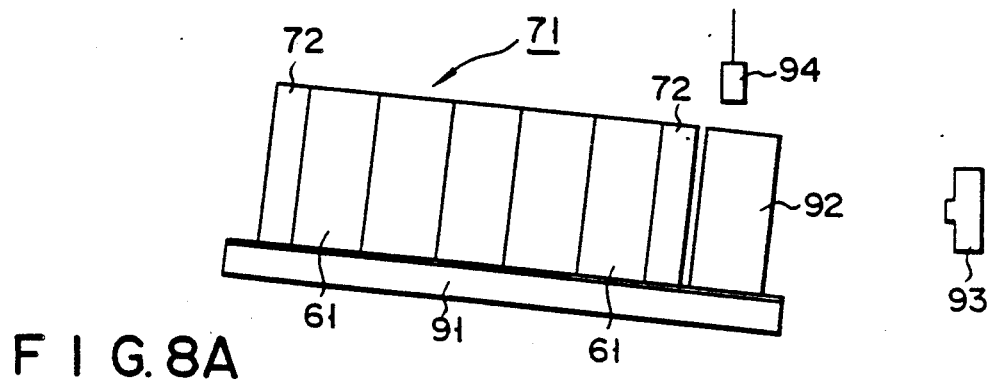
F I G. 8A
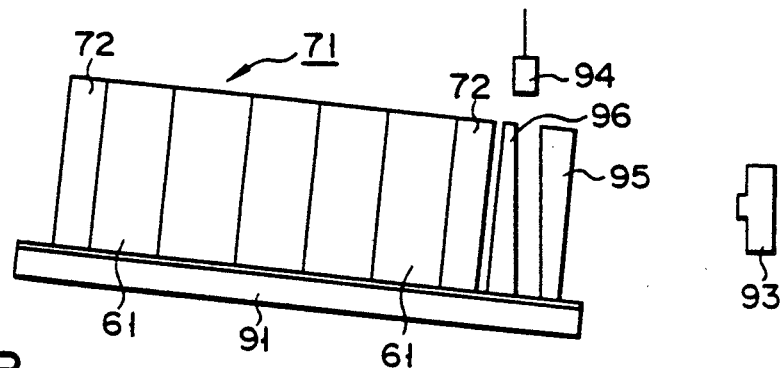
F I G. 8B
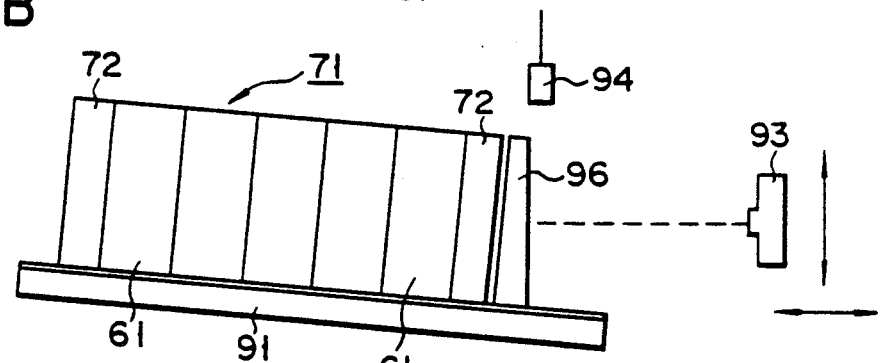
F I G. 8C
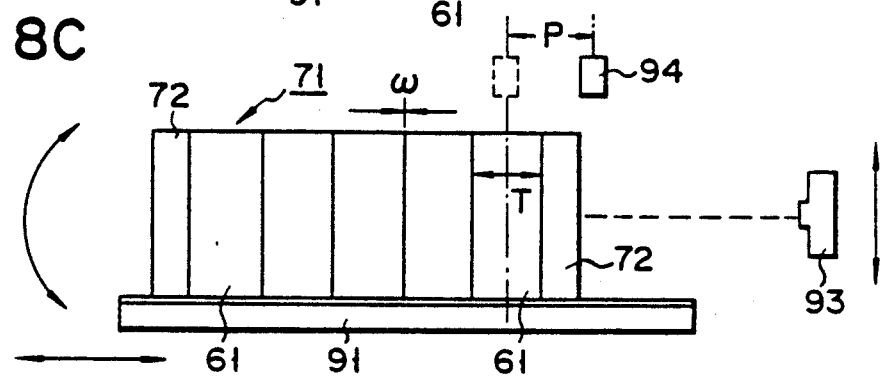
F I G. 8D

DOPANT FILM AND METHODS OF DIFFUSING IMPURITY INTO AND MANUFACTURING A SEMICONDUCTOR WAFER

This is a division of application Ser. No. 07/263,202 now U.S. Pat. No. 5,024,867, filed Oct. 27, 1988.

BACKGROUND OF THE INVENTION

1. Field of the Invention

The present invention relates to a dopant film used as an impurity source adapted to diffuse a semiconductor impurity, such as phosphorus, boron, etc., into a semiconductor wafer (substrate), a method of diffusing an impurity into the semiconductor wafer by the use of the dopant film, and a method of manufacturing the semiconductor wafer.

2. Description of the Related Art

To form a diffusion layer, serving as a collector layer of a transistor, in a silicon wafer for a power device, an impurity is first deposited at a high concentration on both of major surfaces of a raw silicon wafer. Next, glass formed over the surfaces is removed, and then a slumping process is conducted to diffuse the impurity deep into the wafer by a long thermal process at a high temperature, forming impurity diffusion layers over the major surfaces of the wafer. The impurity layer on one major surface of the wafer is subsequently machined away, and then the major surface of the wafer is polished to a mirror surface. The impurity layer over the other surface of the wafer is used as the collector layer of a power transistor. As described above, to diffuse an impurity into a silicon wafer, the impurity layer is deposited over a surface of the wafer, and subsequently diffused into the wafer by long heat treatment of the wafer at a high temperature. To deposit the impurity, there are several methods: (a) coating the surface of the wafer with a liquid impurity by the use of a spin or spray; (b) gasifying an impurity to adhere to the surface of the wafer; and (c) evaporating a solid impurity to adhere to the surface of the wafer.

Recently, a sophisticated method is frequently used which sandwiches a dopant film containing a semiconductor impurity at a high concentration between wafers and directly diffuses the impurity into the wafers from the dopant film. The advantage of the method is to reduce the conventional processes of: depositing an impurity onto a surface of a raw wafer; removing glass formed over the surface of the wafer; stacking the wafer; slumping for diffusing the deposited impurity deep into the wafer; and removing glass formed over the wafer to the processes of: alternate stacking of a wafer and a dopant film; slumping; and removing glass.

As disclosed in U.S. Pat. No. 3,971,870 and Japanese published Patent Specification No. 59-32054, there are two types of dopant film. The first type consists of an impurity compound for diffusion and one selected from the group consisting of cyanoethyl cellulose, methyl cellulose, poly vinyl alcohol, starch and poly vinyl butyral. The second type consists of a vinyl synthetic resin which is an organic binder, an inorganic binder, a proper amount of release auxiliary agent and an impurity compound for diffusion. The vinyl synthetic resin may be a polymer such as poly vinyl acetate, poly methyl vinyl ketone, poly vinyl pyrolidone, methyl acrylate or ethyl acrylate or a copolymer mixed with cellulose nitrate. The inorqanic binder may be, in the case of silanols, silicon hydroxide, trimethylene silanol or triethylene silanol, or, in the case of the organic aluminum compound, aluminum methylate, aluminum ethylate, aluminum propylate or aluminum butylate.

Particularly where the second type of dopant film is used, as disclosed in Japanese laid-open patent application No. 54-84474, after the organic binder is decomposited and burned at about 500° C., the impurity can be diffused for hours at about 1200° C.

500 to 1,000 wafers are subjected to the impurity diffusion in a lot. Hence, prior to the impurity diffusion a work must be done to take out wafers from a container one by one and sandwich a dopant film between adjacent ones of the wafers. This work is very laborious and time-consuming. Moreover, because of this hand work, inadequate adhesion can occur between the wafer and the film. In the event of the inadequate adhesion, the depth of diffusion of the impurity will vary from wafer to wafer. To eliminate the variation in the diffusion depth, the dopant films must be adhered to the wafers in the same condition. In practice, however, this is impossible because of the hand work. In addition, the wafer and the film might be adhered by undue force, breaking the wafer.

with large-diameter (e.g. 125 mm) wafers for power devices, they are liable to suffer from breakage or a trouble of mask alignment incapability due to the warp of the wafers resulting from the formation of various layers over the wafers. For this reason the wafers are made large in thickness. That is, a power-device wafer has which a non-diffusion layer into which various regions are to be formed on a high-concentration diffusion layer (N+ layer or P+ layer) adjacent to a collector layer. Since various processes are needed to form the regions, the wafer must have a minimum thickness to endure these processes. The thickness of the wafer depends on the thickness of the high-concentration impurity layer. The minimum thickness of the high-concentration impurity layer has increased with an increase in the wafer diameter. The high-concentration impurity layer is usually formed by diffusion of impurity into the wafer.

In general, with the diffusion of an impurity into a silicon wafer, the deeper the diffusion, the lower the impurity concentration and the slower the diffusion speed. To diffuse the impurity deep into the wafer, therefore, a heat treatment must be done for hours. However, because of the long heat treatment, the concentration gradient (concentration profile) becomes gentle, increasing the sheet resistance of a high-concentration layer. This will increase the thermal lost at a collector electrode and lower characteristics of the device. To restrict the sheet resistance below a certain value, therefore, the thickness of the high-concentration layer adjacent to the collector layer will suffer from a limitation.

Conventionally, a wafer used for a power semiconductor device is fabricated by lapping a starting or raw wafer of about 600 μm in thickness and processing the lapped wafer. The starting wafer is produced by slicing an ingot and lapping the sliced wafer. To produce the starting wafer of 600 μm in thickness, a material is needed which has a thickness of about 1200 μm, twice that of the wafer. In other words, to produce a starting wafer of 600 μm thick, a material of 600 μm thickness will be wasted.

FIGS. 1A through 1D are sectional views of a structure in processes for producing an end wafer according to a conventional method. A starting OSL wafer 10 of 600 μm thickness is prepared (FIG. 1A). This wafer is produced by slicing an ingot and lapping a resultant wafer. In this case, a material of the ingot, which is wasted by the slicing is about 350 μm in thickness, and a material of the sliced wafer, which is wasted by the lapping is about 200 μm in thickness. Hence, the thickness of the portion of the ingot, which is wasted in producing the starting wafer of 600 μm thick is 550 μm. Subsequently, wafer 10 is subjected to impurity diffusion to form high-concentration impurity diffused layers 11 on either side thereof (FIG. 1B). Thereafter, a side of wafer 10 is removed by a grinder and then subjected to lapping to remove one of diffused layers 11 as shown in FIG. 1C. The surface of wafer 10, from which the diffused layer has been removed, is subsequently mirror-polished to form a wafer with a mirror surface (FIG. 1D). In this way an end wafer or OSL (one side lapped) wafer is produced.

The loss of the wafer due to grinding, lapping and mirror-polishing is about 300 μm in thickness. In the conventional method, although the starting wafer has a thickness of 600 μm, the thickness of the OSL wafer is 300 μm, and hence half of the material is lost. When the wafer is 125 mm in diameter, the amount of the loss will be about 16 g. This is inevitable in the conventional method. The cost assignment of OSL wafers on the market is the profit of 10%, the overhead cost of 15% and the direct cost of 75%. Further, the cost of the raw wafer amounts to 56.4% of the direct cost. Namely, the cost of the wafer itself is very high. Therefore, the conventional method, which wastes a large quantity of material in producing an end water, cannot lower the cost of the end wafer.

As described above, the problem with the conventional method is that, since a large proportion of a raw wafer is wasted to obtain an end wafer, the cost of the end wafer becomes very high.

SUMMARY OF THE INVENTION

It is accordingly an object of the present invention to provide a dopant film which is suitable for automated alternate stacking with semiconductor wafers and hence labor saving, and can enhance the uniformity of adhesion to the wafers.

The dopant film according to the present invention is characterized in that both surfaces of the dopant film containing an organic binder, an inorganic binder and a compound of an impurity element for diffusion are coated with adhesive.

The above dopant film permits automated alternate stacking with semiconductor wafers, providing an advantage of labor saving. When the alternate stacking is automated, it will become hard for the wafer breakage to occur, sharply decreasing the rate of breakage. Furthermore, since the adhesion of a semiconductor wafer improves, the variation in the diffusion depth will decrease.

It is another object of the present invention to provide a method of diffusing an impurity into a semiconductor wafer, which can diffuse the impurity deep into the semiconductor wafer by a short heat treatment, thereby making the impurity concentration profile abrupt.

The impurity-diffusing method of the present invention is characterized in that, in the method of diffusing an impurity into a semiconductor wafer by the use of a dopant film sandwiched between semiconductor wafers, the dopant film containing an organic binder, an inorganic binder and a compound of an impurity element for diffusion and both surfaces thereof being coated with an adhesive, the weight percentage of the impurity is 9%~22% in the case where the impurity element is boron or 12%~20% in the case of phosphorus.

According to the impurity diffusion method, deep diffusion of the impurity into the semiconductor wafer can be achieved by a short heat treatment so that the impurity concentration profile is made abrupt. Therefore, even if a layer of high impurity concentration is increased in thickness with increased diameter of a semiconductor wafer, the sheet resistance thereof does not become high, improving the characteristics of a semiconductor device.

It is still another object of the present invention to provide a semiconductor wafer manufacturing method which can inexpensively manufacture a semiconductor wafer having an impurity diffusion layer on one surface thereof.

The semiconductor wafer manufacturing method comprises the steps of diffusing an impurity into a semiconductor wafer through both surfaces thereof to form impurity diffusion layers, dividing the wafer into two wafers in the direction of thickness, and polishing to a mirror surface the surface of each of the divided wafers which is opposite to the surface on which the impurity diffusion layer is formed.

According to the semiconductor manufacturing method of the present invention, since a semiconductor wafer having impurity diffusion layers on both surfaces thereof is sliced into two wafers which are to be utilized later, the material loss per wafer is reduced more than the conventional method.

BRIEF DESCRIPTION OF THE DRAWINGS

FIGS. 5A through 5C are characteristic diagrams of the sheet resistance $\rho s(\Omega)$ of a wafer with respect to the depth within the wafer obtained when desired values of the diffusion depth are set to 150 μm, 180 μm and 220 μm, respectively;

FIGS. 6A through 6E are sectional views of a semiconductor wafer at steps in a method of manufacturing a semiconductor wafer according to another embodiment of the present invention;

FIGS. 8A through 8D show the stacked structure of FIG. 7 in steps in slicing it.

DETAILED DESCRIPTION OF THE PREFERRED EMBODIMENTS

Figure 1A:
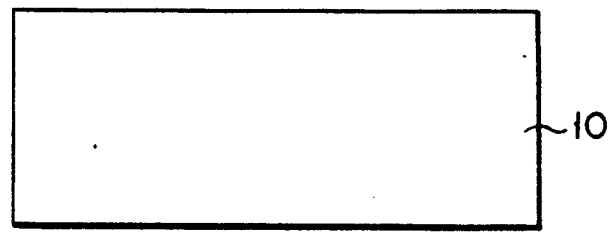
FIGS. 1A through 1D are sectional views of a semiconductor wafer at steps in a conventional method of manufacturing a semiconductor wafer.
Figure 1B:
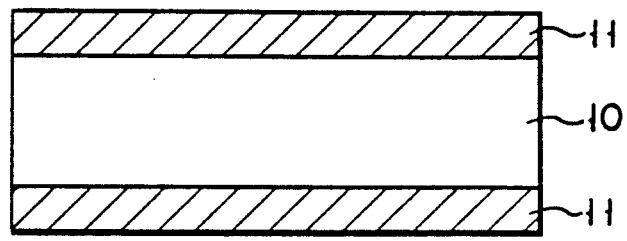
Figure 1C:
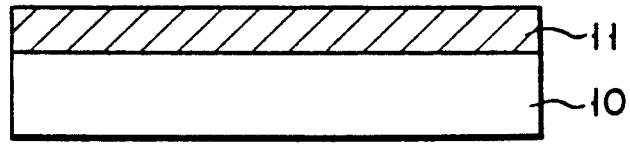
Figure 1D:
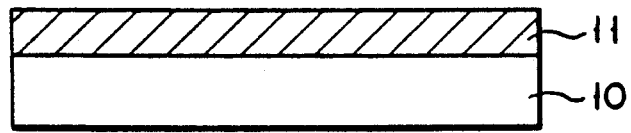
Figure 2:
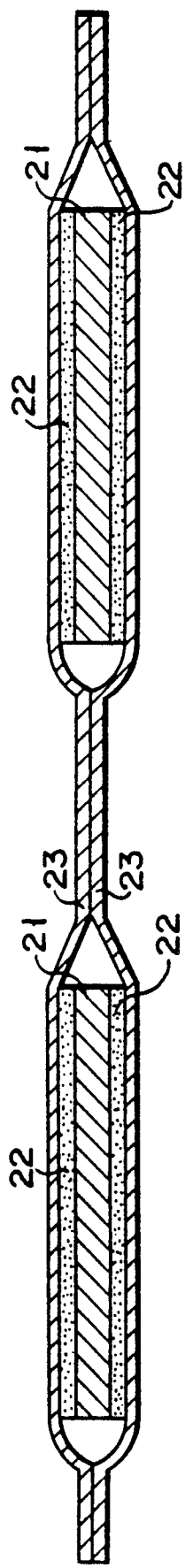
FIG. 2 is a sectional view of a dopant film according to an embodiment of the present invention.

FIG. 2 shows in a sectional form a dopant film according to an embodiment of the present invention. The dopant film is formed in the following way.

As a vinyl synthetic resin acting as an organic binder, poly vinyl acetate and a cellulose nitrate copolymer are used, and, as an inorganic binder, silicon hydroxide is used. These binders are mixed with boron oxide ($B_2O_3$) which is a compound of an impurity element acting as a impurity diffusion source. The mixture is solubilized in ethanol. The solution is put into a clean fluoric-resin plate (not shown) and then dried at a temperature above 50° C. to form a dopant film 21 of 50 μm in thickness and about 10% in the concentration of $B_2O_3$.

Subsequently, the film is removed from the plate and then cut to the dimensions (e.g., 100±1 mmφ, flat 30–35 mm) and the shape of a Silicon wafer on which the dopant film is to be stacked. Next, both surfaces of film 21 are coated with an acrylic adhesive by a spray and then film 21 is sandwiched between two roll-form releasable sheets with the result that an end dopant film is produced. Although only two films are shown to simplify the drawing, many films 21 are actually sandwiched in the direction of extension of sheet 23. The dopant film is stored in the form of a roll.

Figure 4:
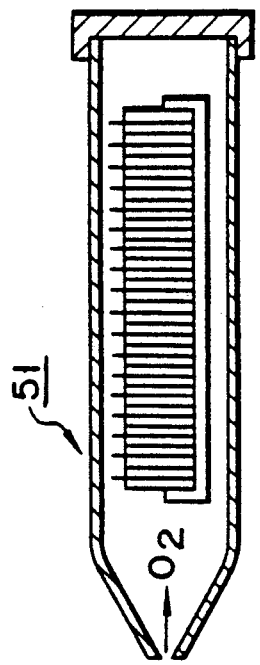
FIG. 4 shows a furnace where the structure of FIG. 3 is located.
Figure 3:
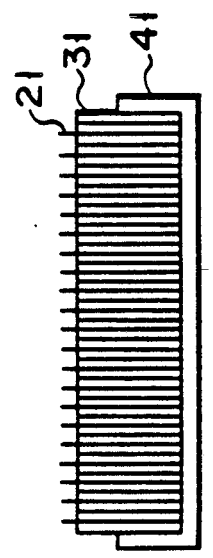
FIG. 3 shows a structure of alternate layers of the dopant film of FIG. 2 and a semiconductor wafer.

For the use of the films produced as described above, a roll of the films is loaded into an automatic stacking machine. This machine takes silicon wafers one at a time out of a container containing 500 wafers in a lot (each of, e.g., 100 mmφ, resistivity of 5Ω.cm, P type, and (1 1 1) plane), releases a portion of the releasable sheet 23 corresponding to one dopant film each time a wafer is taken out, and laminates the wafer with film 21. In this way, wafer 31 is automatically laminated with film 21, producing a laminated structure of the wafers and films as shown in FIG. 3. The resultant structure is placed on a boat 41 as shown in FIG. 3, and then inserted into a diffusion furnace 51 as shown in FIG. 4. This furnace 51 is supplied with oxygen gas at a rate of 2l/min. and heated by program control to burn organic hydrocarbon for ten minutes at 500° C. Subsequently, the temperature of the furnace is raised to 1250° C. to carry out the impurity diffusion for 100 hours. Afterward, the structure is taken out of the furnace and immersed in hydrofluoric acid of a concentration of 49% so as to separate wafers 31 from one another and remove boron silicate glass formed on the surfaces of wafers 31. In this way silicon wafers having high-concentration diffusion layers on their both sides are produced.

The above dopant films provide the following advantages. (a) Automated stacking with the wafers are made possible, providing a great advantage in labor saving. By the way, for 500 wafers, the conventional stacking method requires one hour for a person. The calculations of the repayment cost and electric power cost for the equipment of the automated machine reveal that the cost per wafer becomes about one fourth of that in the conventional method. (b) Due to the automated stacking the uniformity of adhesion to the wafers improves, decreasing the variation in the diffusion depth at the time of diffusion. (c) Being stored as sandwiched between the releasable sheets, the dopant films absorb little moisture at the time of storage, keeping the characteristics of the wafers stable and hence decreasing the variation in the diffusion depth. (d) With the conventional manual stacking, the wafer and the film might be adhered to each other by undue force, causing wafer breakage frequently. The rate of breakage was 0.8%. In the automated stacking, no wafer breakage occurs.

The organic binder and inorganic binder need not be limited to those used in the above embodiment, and instead t e binders disclosed in the above-mentioned U.S. Pat. No. 3,971,870 and Japanese published specification No. 59-32054 may be used.

Next a second embodiment of the present invention will be described.

100 silicon wafers were prepared which were each of 100±0.5 mmφ, resistivity of 8–10 Ωcm, P type, orientation of plane (1 1 1)±1 degree and 580±10 μm thick. Between the wafers was sandwiched a dopant film both surfaces of which were coated with an acrylic adhesive so as to provide a stacked structure of wafers. The dopant film was formed by mixing poly vinyl acetate as an organic binder, alumina as an inorganic binder and boron oxide ($B_2O_3$) as a compound of an impurity element for diffusion. The mixing ratio was set in two ways as indicated in Table 1.

TABLE 1

| Film | $B_2O_3$ | Organic Binder | Inorganic Binder |
|---|---|---|---|
| B | 9.8% | 40.2% | 50% |
| A | 18.3% | 41.7% | 40% |

Next, the stacked structure is inserted into a furnace supplied with $N_2$ gas and held at 400° C., and heated up to 500° C. to burn poly vinyl acetate out. The burning time is 100 minutes. The temperature of the furnace is raised to 1250° C. by program control so as to diffuse an impurity to a desired depth of the wafers. In this embodiment, the diffusion depth was set to desired values of 150 μm, 180 μm and 220 μm. During this heat treatment, only $O_2$ gas is flowed through the furnace instead of $N_2$ gas described above. Thereafter the furnace is lowered to 800° C. by the program control and when 800° C. is reached, the stacked structure is drawn from the furnace. The stacked structure is subsequently immersed in hydrofluoric acid so as to remove boron silicate glass formed on the surfaces of the stacked structure. Then the wafers are separated from one another to measure the diffusion depth xj of each of the wafers. The xj is measured from a change in resistance with respect to the depth in the wafer after it has been subjected to angle lapping. The measurement of the resistance was performed by the use of the spreading resistance probe method. The changes in the sheet resistance ρs with respect to the depth in the wafer for the xj desired values of 150 μm, 180 μm and 220 μm are shown in FIGS. 5A, 5B and 5C, respectively. The depth xj of the formed impurity diffusion layers and the sheet resistance ρs(Ω) are tabulated as follows.

TABLE 2

| Desired Value (μm) | 150 | 180 | 220 |
|---|---|---|---|
| Film B | | | |
| xj | 158 | 182 | 215 |
| ρs | 0.067 | 0.090 | 0.091 |
| Film A | | | |
| xj | 154 | 196 | 234 |
| ρs | 0.042 | 0.034 | 0.031 |

The $B_2O_3$ concentration in the conventional dopant film was below 5%. With the $B_2O_3$ concentration of below 5% and the desired value of 220 μm, the results of the impurity diffusion were such that xj=205 μm and ρs=0.15 Ω.

From the Table 2 it was found that, where the film A or B which is higher in boron concentration than the conventional film is used, the diffusion depth per unit time is large and the profile is made abrupt. Further, it was found that, where the desired value of xj is set to 180 μm, xj of the film B is 10% larger than that of the film A (the diffusion time is reduced by more than 20%) and the sheet resistance is reduced by more than 60%.

Next, power transistors formed in the wafers were examined in the reduction rate of their defects in parameters of $I_{CB}$ (collector-base current), $I_{CE}$ (collector-emitter current), K (gain) and $V_{CE}$ (SAT) (collector-emitter saturation voltage). The results were such that 50% in $I_{CB}$, 80% in $I_{CE}$, 100% in K, and 80% in $V_{CE}$ (SAT).

For dopant films whose boron concentration is about 22% as well, substantially the same defect reduction rate was confirmed.

Next a third embodiment of the present invention will be described.

100 silicon wafers were prepared which are each of 100±0.5 mmφ, resistivity of 50–70 Ωcm, N type, orientation of plane (1 1 1)±1 degree and 580±10 μm thick. Between the wafers was sandwiched a dopant film both surfaces of which were coated with an acrylic adhesive so as to provide a stacked structure of wafers. The dopant film was formed by mixing poly vinyl acetate as an organic binder, alumina as an inorganic binder and phosphorus oxide ($P_2O_5$) as a compound of an impurity element for diffusion. The mixing ratio was set in two ways as indicated in Table 3.

TABLE 3

| Film | $P_2O_5$ | Organic Binder | Inorganic Binder |
|---|---|---|---|
| D | 12.4% | 65% | 22.6% |
| C | 16.1% | 62.1% | 21.8% |

Next, the impurity was diffused into the stacked structure from the film by the same processes as those of the second embodiment. In this embodiment, the diffusion depth was set to desired values of 130 μm, 160 μm and 190 μm. The results are tabulated as follows.

TABLE 4

| Desired Value (μm) | 130 | 160 | 190 |
|---|---|---|---|
| Film D | | | |
| xj | 130 | 158 | 187 |
| ρs | 0.092 | 0.077 | 0.068 |
| Film C | | | |
| xj | 135 | 175 | 215 |
| ρs | 0.070 | 0.056 | 0.050 |

The $P_2O_5$ concentration in the conventional dopant film was below 10%. With the $P_2O_5$ concentration of below 10% and the desired value of 180 μm, the results of the impurity diffusion were such that xj=180 μm and ρs=0.09 Ω.

From the Table 4 it was found that, where the film C or D which is higher in phosphorus concentration than the conventional film is used, advantageously the diffusion depth per unit time becomes large and the profile is made abrupt. Substantially the same effect was also confirmed for the case where the concentration of phosphorus is about 20%.

Power transistors formed in the wafers were examined in the parameters of $I_{CB}$ (collector-base current), $I_{CE}$ (collector-emitter current), K (gain) and $V_{CE}$(SAT) (collector-emitter saturation voltage). As a result, it was found that their fraction defective is reduced.

In the case where dopant films are used which contain As or Sb instead of P in the third embodiment, the same advantage as that of the third embodiment was obtained by setting the impurity concentration to 10% ~20%.

Since the dopant films according to the above embodiments are adapted for automated stacking with wafers, the uniformity of adhesion to the wafers can be enhanced and hence the variation in the depth of diffusion of an impurity within the wafers can be made small. In addition, because of the automated stacking, the work speed improves and thus the cost reduces. Moreover, because of the automated stacking, no undue force will be applied to the wafers and hence it will be difficult for the wafer breakage to occur.

According to the impurity diffusing method of the present invention, the deep diffusion of an impurity into a semiconductor wafer can be attained by short heat treatment so that the energy fee reduces and the impurity concentration profile becomes abrupt. Therefore, even if a layer of high impurity concentration adjacent to a collector layer increases in thickness with increased diameter of a semiconductor wafer, the sheet resistance thereof does not become high, improving the characteristics of a semiconductor device.

A semiconductor wafer manufacturing method according to another embodiment of the present invention will now be described with reference to FIGS. 6A through 6E, which are sectional views of a semiconductor structure at steps in the manufacturing method.

First, a starting wafer 61 of 1200 μm thickness which is twice that of the conventional starting wafer is prepared (FIG. 6A). As in the conventional method, the wafer 61 of a thickness of 1200 μm is formed by slicing an ingot and lapping the obtained slice of the ingot. Wafer 61 has a diameter of 125 mm±0.5 mm and a resistivity of 40 to 50 Ωcm and is doped with N type phosphorus (P). The major surfaces of the wafer has been lapped by abrasive powder with grain size of JIS #1000 so that a difference between maximum and minimum values in thickness of the wafer due to variation in the degree of parallelization of the major surfaces thereof may be below 5 μm. A material of the ingot, which is wasted by the slicing is about 350 μm in thickness, and a material of the sliced wafer, which is wasted by the lapping is about 200 μm in thickness. Hence, the material loss involved in producing the starting wafer is about 550 μm in the thickness of wafer as in the conventional method.

Next diffusion layers 62 are formed on the major surfaces of starting wafer 61 (FIG. 6B). In this case, five lots of wafers collectively undergo the diffusion with 50 wafers in a lot. More specifically, the starting wafers are cleaned with alkali washings and then five lots of the wafers are placed side by side on a boat made of quartz. After the boat is inserted into a diffusion furnace with an oxygen ambience of 1200° C., mixed gas of oxygen gas and steam obtained by evaporating $POCl_3$ with $N_2$ gas is introduced into the furnace. Consequently, after the lapse of a predetermined time, high-concentration impurity layers are deposited on the major surfaces. The introduction of the steam of $POCl_3$ is stopped so as to take out the wafers and the boat from the furnace. Subsequently, phosphorous glass formed on the surfaces of the wafers are removed by HF (hydrofluoric acid) solution with the result that wafers on both surfaces of which high-concentration impurity layers are deposited are formed. Thereafter, a fraction of the wafers in each lot is subjected to measurement of the surface impurity concentration so as to examine whether the impurity concentration is above $10^{20}/cm^3$ or not. When the impurity concentration is above $10^{20}/cm^3$, the wafers in five lots are placed side by side on a boat of quartz. The boat is inserted into a furnace with oxygen ambience of 1250° C. to perform a slumping process for diffusion for a predetermined time. After the slumping processing, the boat and the wafers are taken out from the furnace so as to remove phosphorous glass formed on the wafers with HF solution again. Thereafter, a fraction of the wafers in each lot is subjected to measurement of the diffusion depth of diffusion layers 62 so as to examine whether the diffusion depth lies within 150 $\mu$m±5 $\mu$m or not. The measured values of each lot are recorded.

Figure 7:
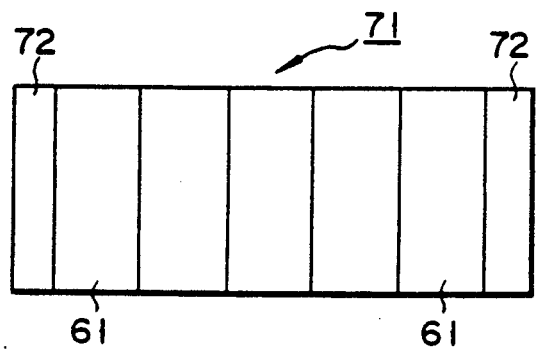
FIG. 7 shows a stacked structure of wafers.

The wafers, which have been subjected to the diffusion process, are adhered to each other as shown in FIG. 7 to construct an ingot 71. As the adhesive use is made of paraffin having a melting point of 70° C. To adhere the wafers, each of them is previously heated. The surface of a heated wafer is coated with paraffin and another wafer is placed on the paraffin-coated surface of that wafer. Then the surface of the another wafer is coated with paraffin and still another wafer is placed on the paraffin-coated surface of the another wafer. This process is repeated to bond all the wafers, thereby forming ingot 71. In this case, the wafers are stacked using the orientation flat formed on each wafer as a standard for positioning. Reinforcing wafers 72 are bonded to both the end surfaces of ingot 71. The reinforcing wafers also have a diameter of 125 mm±0.5 mm like wafers 61. The thickness of reinforcing wafers 72 is, for example, 600 pm and the surfaces thereof have undergone the JIS #1000 lapping. After wafers 72 have been bonded, ingot 71 is gradually cooled with a pressure of not less than 100 g/cm² being applied to ingot 71 in order to draw off extra paraffin at the junctions of wafers 61. The extra paraffin is swept away by the use of trichloro ethylene. The overall length of ingot 71 inclusive of reinforcing wafers 72 is measured to calculate and record the thickness of the paraffin per wafer.

Next the above ingot 71 is sliced into wafers 81 as shown in FIG. 6C. More specifically, the slicing is performed as follows. Ingot 71 is first bonded onto a slicing carbon base by the use of a adhesive resin (e.g., epoxy resin). The ingot bonded onto the base is loaded to a diamond-blade type slicing machine of, for example, TS-27 type manufactured by Mayer & Burget Co. A diamond blade used in this case is 27 inches in outside diameter, 340 $\mu$m in blade thickness and 150 $\mu$m in ground-metal thickness. When the ingot is cut by the blade, the cutting allowance is 400 $\mu$m.

Figure 9:
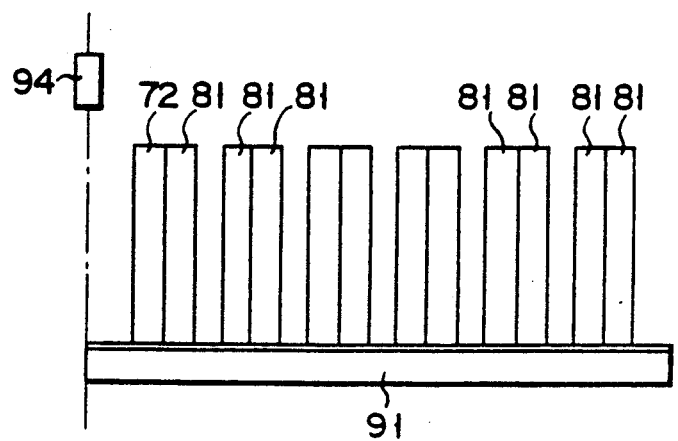
FIG. 9 shows sliced wafers.

The slicing process will be described with reference to FIGS. 8A through 8D. A position-correcting wafer 92 is first bonded onto slicing carbon base 91 in front of ingot 71. The dummy wafer 92 has a thickness of e.g., 3000 $\mu$m. A position detecting sensor 93 is next placed to face position correcting wafer 92 as shown in FIG. 8A. Reference numeral 94 denotes the diamond blade of the slicing machine. Next, position correcting wafer 92 is sliced by means of diamond blade 94 (FIG. 8B). Subsequently, unwanted wafer 95 is removed, and the position of sensor 93 is adjusted so that it may become parallel to the cutting plane of the remaining wafer 96 (FIG. 8C). After the removal of the remaining wafer 96, the inclination of slicing carbon base 91 is adjusted so that the plane of reinforcing wafer 72 may become parallel to sensor 93 and the front plane of wafer 72 may be in alignment with diamond blade 94. As a result, the adjustment of the cutting direction and position of diamond blade 94 with respect to wafers 61 is completed. Afterward, base 91 is manually fed forward by a distance of half of the cutting allowance=400 $\mu$m/2=200 $\mu$m. Automatic feeding mechanism of the slicing machine is then turned on to slice ingot 71 at a feed pitch of P. Here, P=T+$\omega$ where T stands for the average thickness of the wafer and $\omega$ the thickness of paraffin per wafer. Assuming that T is 1200 $\mu$m and $\omega$ is 2 $\mu$m, P=1202 $\mu$m. In this case, the slicing speed is 50 mm/min, the number of revolutions of the blade is 2000 rpm, and city water is used as cooling water. By the slicing process described above, each wafer is divided into two parts (each part corresponds to wafer 81 of FIG. 6D) as shown in FIG. 9.

Figure 6D:
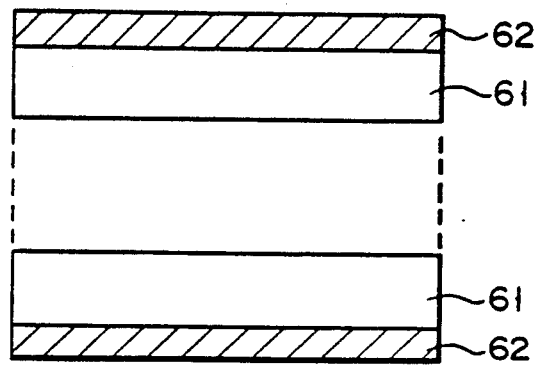

The divided wafers are removed from the base and then the adhesive and paraffin are removed by the use of chemicals to separate the wafers and clean the surfaces thereof. Thereafter, the slicing plane of each wafer 81 is subjected to grinding by means of an automatic grinder (FIG. 6D). The thickness of the portion of the wafer 81, which is removed by the grinding, depends on the desired finished thickness of an intrinsic layer free from impurities which is left in the final process. For example, the thickness of the removed portion is set to 180 $\mu$m. As the automatic grinder, SVG-502 manufactured by Shibayama machine manufacturing Co. is available. As the grinding stone for the rough grinding use was made of a type of #400, and for the finish grinding a type of #1200 was used. The rough grinding speed was 150 $\mu$m/min and the finish grinding speed was 10 $\mu$m/min.

Figure 6E:
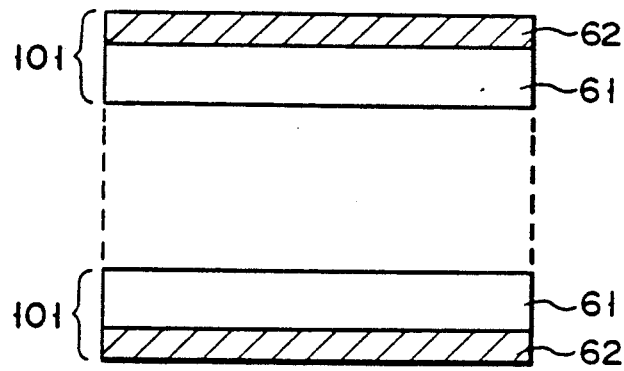

Afterward, the polished surface of each wafer 81 is mirror-polished to obtain a mirror surface. This process is performed after each wafer 81 is bonded to a polishing plate. As abrasive powder use is made of colodile silica made of SiO$_2$, and the thickness of the portion of the wafer 81, which is removed by the mirror polishing, is 20 $\mu$m. A wafer which has been polished is removed from the plate and then cleaned with chemicals to remove the adhesive, thereby completing an OSL wafer 101 having diffusion layer 61 on one surface thereof (FIG. 6E).

Table 5 shows a comparison of the material loss between the conventional method and the inventive method.

TABLE 5

| Starting Wafer Thick. | Conventional 600 $\mu$m | Invention 1200 $\mu$m |
| --- | --- | --- |
| Material Loss in Producing Starting Wafer | 550 $\mu$m | 550 $\mu$m |
| Slice Loss after Diffusion | | 400 $\mu$m |
| Grinding, Mirror Polishing Loss | 300 $\mu$m | 200 $\mu$m |
| Material Loss in Producing One Final Wafer | 850 $\mu$m | 575 $\mu$m |

In the diffusion step described with reference to FIG. 6B, diffusion layers 62 are formed using mixed gas of oxygen gas and steam obtained by evaporating POCl$_3$ with N$_2$ gas. However, diffusion layers 62 may be formed, using a dopant film containing an impurity, by a method similar to the method as described in the preceding embodiments with reference to FIGS. 2 to 4.

As described above, the percentage of a raw wafer in the cost required to produce an OSL wafer is high and hence the cost down of the raw wafer leads to the cost down of the OSL wafer. The material loss produced in manufacturing a raw wafer amounts to 550 $\mu$m which is a sum of 350 $\mu$m for slicing and 200 $\mu$m for polishing. This loss does not depend on the thickness of the wafer. Thus, there is no difference of the loss between the conventional method and the inventive method. According to the inventive method, since a wafer is sliced into two wafers after the diffusion process, a slice loss of 400 μm results. However, the conventional method does not yield this type of loss. Instead the conventional method yields a loss of 300 μm in grinding and mirror polishing processes after the diffusion process. On the other hand, since the inventive method does not require the polishing of the diffusion layer, the amount of the loss can be reduced accordingly. According to the conventional method, a total of such losses as described above amounts to 850 μm per wafer. However, according to the method of the present invention, since the losses shown in Table 5 are produced for two wafers, the material loss per wafer can be 575 μm, which is 275 μm less than 850 μm in the conventional method. Consequently, the waste of material can be reduced and thus OSL wafers can be manufactured inexpensively.

What is claimed is:

1. A method of manufacturing a semiconductor substrate comprising the steps of:

diffusing an impurity into both major surfaces of a semiconductor wafer to form diffusion layers;

dividing said semiconductor wafer into two wafers in the direction of thickness thereof; and polishing surfaces of said two wafers divided that are opposite to said diffusion layers to a mirror surface.

2. A method according to claim 1, wherein
   in the step of dividing said semiconductor wafer into two wafers in the direction of thickness thereof, said semiconductor wafer is divided in a state of ingot in which a plurality of wafers on which said diffusion layers are formed are bonded to each other.

3. A method according to claim 1, wherein
   the step of dividing said semiconductor wafer into two wafers in the direction of thickness thereof is performed by a slicing method using a diamond blade.

4. A method according to claim 2, wherein
   reinforcing wafers are adhered to both end surfaces of said ingot.

5. A method according to claim 3, wherein
   a position correcting wafer is disposed at one end surface of said ingot so as to correct a positional relationship between a plane of said ingot and a plane of said diamond blade in slicing said ingot.

* * * * *

UNITED STATES PATENT AND TRADEMARK OFFICE
CERTIFICATE OF CORRECTION

PATENT NO. : 5,073,517

DATED : December 17, 1991

INVENTOR(S) : Masaburo Iwabuchi et al.

It is certified that error appears in the above-identified patent and that said Letters Patent is hereby corrected as shown below:

Title page, item [30], change "Priority Data, July 14, 1988 [JP] Japan....63-173714" to --Priority Data, July 14, 1988 [JP] Japan...63-173718--.

Signed and Sealed this

Tenth Day of August, 1993

Attest:

MICHAEL K. KIRK

Attesting Officer

Acting Commissioner of Patents and Trademarks